US010566500B2

(12) United States Patent
Pfeuffer

(10) Patent No.: US 10,566,500 B2
(45) Date of Patent: Feb. 18, 2020

(54) OPTOELECTRONIC SEMICONDUCTOR COMPONENT

(71) Applicant: OSRAM Opto Semiconductors GmbH, Regensburg (DE)

(72) Inventor: Alexander F. Pfeuffer, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/307,054

(22) PCT Filed: May 30, 2017

(86) PCT No.: PCT/EP2017/063033
§ 371 (c)(1),
(2) Date: Dec. 4, 2018

(87) PCT Pub. No.: WO2017/215910
PCT Pub. Date: Dec. 21, 2017

(65) Prior Publication Data
US 2019/0140143 A1 May 9, 2019

(30) Foreign Application Priority Data

Jun. 17, 2016 (DE) .......................... 10 2016 111 113

(51) Int. Cl.
*H01L 33/00* (2010.01)
*H01L 33/40* (2010.01)
(Continued)

(52) U.S. Cl.
CPC ............ *H01L 33/405* (2013.01); *H01L 33/02* (2013.01); *H01L 33/382* (2013.01); *H01L 33/44* (2013.01);
(Continued)

(58) Field of Classification Search
None
See application file for complete search history.

(56) References Cited

U.S. PATENT DOCUMENTS 9,130,129 B2 * 9/2015 Liao ......................... H01L 33/42
2011/0266579 A1 11/2011 Nagai
(Continued)

FOREIGN PATENT DOCUMENTS

DE 10 2008 011 848 A1 9/2009
DE 10 2010 024 079 A1 12/2011
(Continued)

*Primary Examiner* — Minh Loan Tran
(74) *Attorney, Agent, or Firm* — DLA Piper LLP (US)

(57) ABSTRACT

An optoelectronic semiconductor component has a semiconductor body, wherein the semiconductor body includes a semiconductor layer sequence having a first semiconductor layer, a second semiconductor layer and an active region that generates or receives radiation disposed between the first semiconductor layer and the second semiconductor layer; the semiconductor body has a functional region in which the first semiconductor layer electrically conductively connects to a first terminal layer and the second semiconductor layer electrically conductively connects to a second terminal layer; an isolating layer is arranged on a side of the first terminal layer facing away from the semiconductor body; an interruption is formed in the isolating layer which at least locally delimits an inner subregion of the isolating layer in a lateral direction; the interruption encloses the functional region in the lateral direction; and in a plan view of the semiconductor component, the interruption overlaps with the active region.

18 Claims, 11 Drawing Sheets

(51) Int. Cl.
*H01L 33/44* (2010.01)
*H01L 33/38* (2010.01)
*H01L 33/02* (2010.01)
*H01L 33/54* (2010.01)
*H01L 33/62* (2010.01)

(52) U.S. Cl.
CPC .............. *H01L 33/54* (2013.01); *H01L 33/62* (2013.01); *H01L 33/38* (2013.01)

(56) References Cited

U.S. PATENT DOCUMENTS

| | | |
|---|---|---|
| 2012/0086026 A1 | 4/2012 | Engl et al. |
| 2013/0140598 A1 | 6/2013 | Höppel et al. |
| 2013/0187192 A1 | 7/2013 | Hoeppel |
| 2013/0228819 A1 | 9/2013 | Engl et al. |
| 2013/0341634 A1 | 12/2013 | Heikman et al. |
| 2015/0014716 A1 | 1/2015 | von Malm |
| 2015/0179873 A1 | 6/2015 | Wunderer et al. |
| 2015/0255685 A1 | 9/2015 | Herrmann et al. |
| 2016/0149086 A1 | 5/2016 | Sim et al. |
| 2018/0254378 A1 | 9/2018 | Scholz |

FOREIGN PATENT DOCUMENTS

| | | |
|---|---|---|
| DE | 10 2010 025 320 A1 | 12/2011 |
| DE | 10 2010 045 784 A1 | 3/2012 |
| DE | 10 2012 217 533 A1 | 3/2014 |
| DE | 10 2015 116 983 A1 | 4/2017 |
| WO | 2013/092304 A1 | 6/2013 |

\* cited by examiner

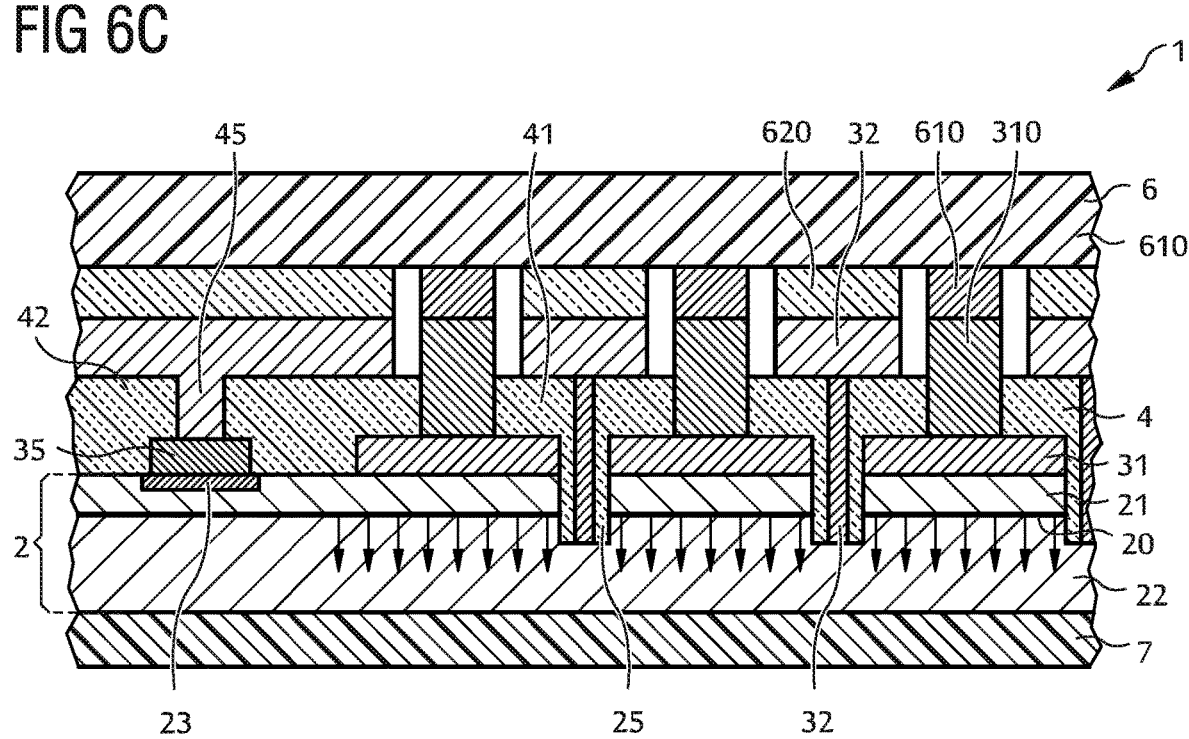

US 10,566,500 B2

OPTOELECTRONIC SEMICONDUCTOR COMPONENT

TECHNICAL FIELD

This disclosure relates to an optoelectronic semiconductor component.

BACKGROUND

In light emitting diodes, silver-containing electrodes are often used to electrically contact the p-side of the semiconductor chip. Migration effects in semiconductor chips can, however, lead to damage due to short circuits or even to destruction. This is particularly important for applications that place particularly high demands on reliability, for example, in automobiles.

Moisture blocking dielectrics can be used to prevent migration. High quality requirements are placed on those materials, especially with regard to void of defects, high transparency, low moisture permeability, homogeneity or high adhesion. However, even when such dielectrics are used, damage to the component may occur.

It could therefore be helpful to increase the reliability of optoelectronic semiconductor components such as LEDs.

SUMMARY

I provide an optoelectronic semiconductor component having a semiconductor body, wherein the semiconductor body includes a semiconductor layer sequence having a first semiconductor layer, a second semiconductor layer and an active region that generates or receives radiation disposed between the first semiconductor layer and the second semiconductor layer; the semiconductor body has a functional region in which the first semiconductor layer electrically conductively connects to a first terminal layer and the second semiconductor layer electrically conductively connects to a second terminal layer; an isolating layer is arranged on a side of the first terminal layer facing away from the semiconductor body; an interruption is formed in the isolating layer which at least locally delimits an inner subregion of the isolating layer in a lateral direction; the interruption encloses the functional region in the lateral direction; and in a plan view of the semiconductor component, the interruption overlaps with the active region.

I also provide an optoelectronic semiconductor component having a semiconductor body, wherein the semiconductor body includes a semiconductor layer sequence having a first semiconductor layer, a second semiconductor layer and an active region that generates or receives radiation disposed between the first semiconductor layer and the second semiconductor layer; the semiconductor body has a functional region in which the first semiconductor layer electrically conductively connects to a first terminal layer and the second semiconductor layer electrically conductively connects to a second terminal layer; an isolating layer is arranged on a side of the first terminal layer facing away from the semiconductor body; an interruption is formed in the isolating layer which at least locally delimits an inner subregion of the isolating layer in a lateral direction; the interruption encloses the functional region in the lateral direction; in a plan view of the semiconductor component, the interruption overlaps with the active region; and in the interruption a metal layer adjoins the first semiconductor layer, wherein the metal layer is at the same potential as the second terminal layer during operation of the semiconductor component.

I further provide an optoelectronic semiconductor component having a semiconductor body, wherein the semiconductor body includes a semiconductor layer sequence having a first semiconductor layer, a second semiconductor layer and an active region that generates or receives radiation disposed between the first semiconductor layer and the second semiconductor layer; the semiconductor body has a functional region in which the first semiconductor layer electrically conductively connects to a first terminal layer and the second semiconductor layer electrically conductively connects to a second terminal layer; an isolating layer is arranged on a side of the first terminal layer facing away from the semiconductor body; an interruption is formed in the isolating layer which at least locally delimits an inner subregion of the isolating layer in a lateral direction; the interruption encloses the functional region in the lateral direction; in a plan view of the semiconductor component, the interruption overlaps with the active region; and during operation of the optoelectronic semiconductor component, in the region of the interruption no charge carriers that generate radiation are injected into the semiconductor body or charge carriers generated by radiation absorption are not guided away from the semiconductor body.

BRIEF DESCRIPTION OF THE DRAWINGS

FIGS. 6A to 6C show a sixth example of an optoelectronic semiconductor component using a schematic plan view (FIG. 6A), a section in a plan view (FIG. 6B) and a section in a sectional view (FIG. 6C).

LIST OF REFERENCE SIGNS

Figure 1A:
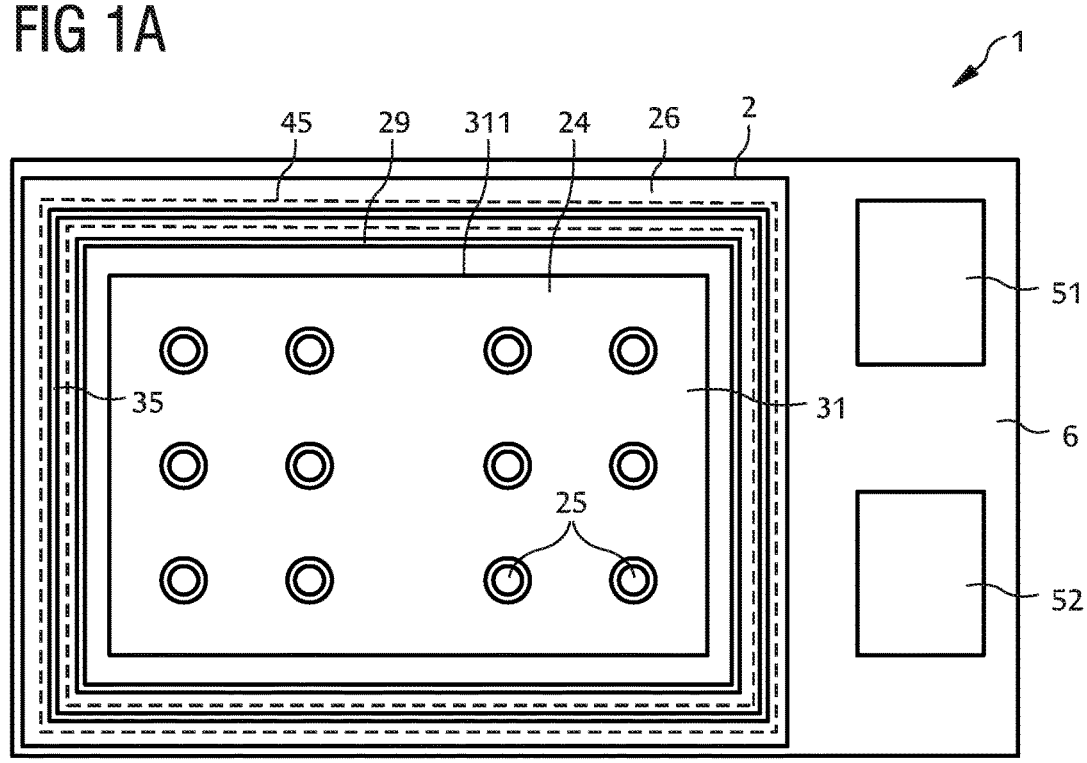
FIGS. 1A and 1B show a first example of an optoelectronic semiconductor component in a schematic plan view (FIG. 1A) and by a section in a sectional view (FIG. 1B).

1 Semiconductor component
2 Semiconductor body
20 Active region
21 First semiconductor layer
22 Second semiconductor layer
23 Subregion
24 Functional region
25 Recess
26 Edge region
27 Segment
29 Opening
31 First terminal layer 310 Connection layer
311 Outer outline of the first terminal layer
32 Second terminal layer
35 Metal layer
4 Isolating layer
41 Inner subregion
42 Outer subregion
45 Interruption
5 Contact
51 First contact
52 Second contact
6 Carrier
610 First carrier layer
620 Second carrier layer
65 Control circuit
7 Further isolating layer

DETAILED DESCRIPTION

I provide an optoelectronic semiconductor component having a semiconductor body. The semiconductor body comprises a semiconductor layer sequence having a first semiconductor layer, a second semiconductor layer and an active region that generates or receives radiation disposed between the first semiconductor layer and the second semiconductor layer. Expediently, regarding their conduction type, the first semiconductor layer and the second semiconductor layer are at least partially different from each other so that the active region is located in a pn-junction. For example, the active region is configured to generate or receive radiation in the ultraviolet, visible or infrared spectral range.

The semiconductor body may have a functional region. In particular, a functional region is considered to be a region of the semiconductor body extending in the lateral direction in which, during operation of the optoelectronic semiconductor component, charge carriers are injected to generate radiation or receive radiation, charge carrier pairs generated by radiation absorption are separated from one another and guided away from the semiconductor body. In addition to the functional region, the semiconductor body may have a further region, for example, an edge region which, unlike the functional region, is not configured to receive or generate radiation.

In case of doubt, a lateral direction is considered to be a direction extending parallel to a main extension plane of the semiconductor layers of the semiconductor layer sequence of the semiconductor body.

The semiconductor component may have a first terminal layer, wherein the first semiconductor layer electrically conductively connects to the first terminal layer. Accordingly, the optoelectronic semiconductor component may have a second terminal layer, wherein the second semiconductor layer electrically conductively connects to the second terminal layer. The first terminal layer and/or the second terminal layer can be formed as a single layer or as a sequence of several layers. In particular, the first terminal layer can fulfil the function of a mirror layer.

In particular in the functional region, the semiconductor body can electrically connect both to the first terminal layer and the second terminal layer. In addition, the active region at the edge region electrically conductively connects to expediently at most one of the first terminal layer and the second terminal layer.

The semiconductor component may have an isolating layer. The isolating layer is arranged in particular on a side of the first terminal layer facing away from the semiconductor body. For example, the isolating layer directly adjoins the first terminal layer at least in places. Furthermore, the isolating layer can adjoin the semiconductor body, in particular the first semiconductor layer and/or the second semiconductor layer, at least in places.

The isolating layer may contain a dielectric material such as an oxide, a silicon oxide or a nitride such as silicon nitride, or a sequence of at least two different dielectric materials such as silicon oxide and silicon nitride. A multilayer system of these materials can combine the advantages of both materials, in particular the good conformal deposition properties of silicon nitride on the one hand and the higher transparency in the blue and ultraviolet spectral range of silicon dioxide on the other hand.

An interruption may be formed in the isolating layer. For example, the interruption delimits an inner subregion of the isolating layer in the lateral direction at least in places, especially along the entire circumference. The isolating layer can have exactly one subregion or a number of subregions.

During operation of the optoelectronic semiconductor component and in the region of the interruption, no charge carriers that generate radiation may be injected into the semiconductor body or the charge carriers generated by absorption of radiation may not be guided away from the semiconductor body. In other words, in a plan view of the semiconductor component, no direct vertical charge carrier injection or discharge takes place in a region overlapping with the interruption.

The interruption may be formed as a separation trench. For example, the separation trench has a longitudinal extension axis, wherein the separation trench has a greater lateral extent along the longitudinal extension axis than along a transverse direction perpendicular to the longitudinal extension axis. The longitudinal axis of extension may be curved in places and/or have one kink or several kinks.

In a plan view of the semiconductor component, the inner subregion of the component may be spaced apart from the edge region. In other words, by the interruption, an inner subregion of the isolating layer is formed to be laterally spaced apart from the edge region.

For example, the interruption formed in particular as a separation trench divides the isolating layer into at least two separate subregions. The subregions do not directly adjoin each other at any point. Especially along the lateral direction, the subregions are arranged next to each other side by side. For example, an outer subregion encloses an inner subregion in the lateral direction, especially completely. During production of the isolating layer, the subregions can emerge from a common layer. Within process-related fluctuations, the subregions therefore have the same material composition and thickness.

The interruption may enclose the functional region in the lateral direction. In other words, in a plan view of the optoelectronic semiconductor component, the functional region is arranged completely within a surface enclosed by the interruption. For example, the functional region is essentially determined by an outer outline of the first terminal layer. In a first terminal layer comprising several parts in the lateral direction, the outer outline is considered to be an envelope of the first terminal layer, for example, in the form of an imaginary elastic band stretched around the first terminal layer.

In a plan view of the optoelectronic semiconductor component, the outer subregion and the functional region are arranged with respect to each other such that they do not overlap. Outside the interruption, the semiconductor body thus electrically conductively connects at most to the first terminal layer or the second terminal layer, but not both to the first terminal layer and to the second terminal layer so that during operation of the semiconductor component no radiation is generated or detected in the active region outside the interruption.

In a plan view of the semiconductor component, the interruption may overlap with the active region. In particular, the interruption may be completely covered by the active region. The active region is therefore not interrupted at the place of interruption.

The semiconductor component may comprise a semiconductor body, wherein the semiconductor body comprises a semiconductor layer sequence having a first semiconductor layer, a second semiconductor layer and an active region arranged between the first semiconductor layer and the second semiconductor layer and configured to generate or receive radiation. The semiconductor body has a functional region in which the first semiconductor layer electrically connects to a first terminal layer and the second semiconductor layer electrically connects to a second terminal layer. An isolating layer is arranged on a side of the first terminal layer facing away from the semiconductor body. In the isolating layer, an interruption is formed which at least partially delimits an inner subregion of the isolating layer in the lateral direction. The interruption encloses the functional region in the lateral direction and, in a plan view of the semiconductor component, overlaps with the active region.

By interruption in the isolating layer, a path of moisture transport is interrupted within the isolating layer or at the interface between the isolating layer and the semiconductor body. Thus, moisture cannot reach the first terminal layer from the edge of the semiconductor component, or at least only with great difficulty. Reliability of the optoelectronic semiconductor component can thus be increased in a simple and reliable way. In addition, the danger of moisture-induced silver migration from the edge of the optoelectronic semiconductor component is prevented in the first terminal layer containing silver since the primary moisture path is interrupted by the interruption in the isolating layer.

In the interruption, a metal layer may adjoin the first semiconductor layer, wherein the metal layer may be at the same potential as the second terminal layer during operation of the semiconductor component. In particular, a p-type first semiconductor layer may be adjacent to a metal layer at the same potential as the second terminal layer configured to electrically contact the second n-type semiconductor layer. Migration effects caused by a silver-containing first terminal layer on p-potential can be eliminated completely or at least as far as possible.

Expediently, the metal layer and the first semiconductor layer are matched to each other such that no or at least no significant current flow occurs between the metal layer and the first semiconductor layer during operation of the semiconductor component. Thus, inside the interruption, the metal layer does not electrically contact the semiconductor component.

A contact resistance between the metal layer and the first semiconductor layer may be so high that during operation of the semiconductor component there is no or at least no substantial current flow between the metal layer and the first semiconductor layer.

A region of the semiconductor body adjacent to the metal layer may be a region in which the semiconductor body is selectively damaged. In this way, a significant injection of charge carriers via the metal layer into the first semiconductor layer can be avoided even in a metal layer forming a comparatively good electrical contact to the first semiconductor layer. For example, in contrast to another region of the semiconductor body, the region is treated such that damage occurs to the semiconductor material, in particular to the first semiconductor layer. This can be done, for example, by treatment in a plasma such as a hydrogen plasma, or by introducing damage to the semiconductor body during deposition of the metal layer, for instance by an accordingly selected sputter deposition.

The metal layer may be formed by the second terminal layer. In this case, within the interruption, no further metal layer adjacent to the first semiconductor layer is required in addition to the second terminal layer. The first semiconductor layer is adjacent to the same material used to electrically contact the second semiconductor layer.

The metal layer may be an additional metal layer to the second terminal layer. The metal layer and the second terminal layer can therefore be chosen independently of each other. For example, in the interruption, the metal layer can be chosen with regard to a high contact resistance to the first semiconductor layer without the second terminal layer being restricted to the material of the metal layer.

The additional metal layer may have a greater lateral transverse expansion, i.e. a lateral expansion transverse to a main direction of extension of the additional metal layer, than the interruption along this direction formed in particular as a separation trench. In this case, the isolating layer can at least partially cover the metal layer, especially on two opposite sides of the interruption. In other words, both the inner subregion and the outer subregion of the isolating layer can be adjacent to the metal layer and overlap it in places.

Expediently, the metal layer and the second terminal layer electrically conductively connect to each other. In particular, the second terminal layer can directly adjoin the metal layer, especially in the interruption. For example, the second terminal layer does not directly adjoin the first semiconductor layer at any point.

The metal layer may have a smaller lateral transverse expansion than the interruption along this direction. In this case, both the metal layer and the first terminal layer may be adjacent to the first semiconductor layer in the interruption.

The semiconductor body may have an opening extending through the first semiconductor layer in the vertical direction, i.e. perpendicular to a main extension plane of the semiconductor layers of the semiconductor body. The opening is located in the lateral direction in particular between the interruption and the functional region. For example, the interruption completely encloses the opening in the lateral direction. Preferably, in the lateral direction, the opening encloses the functional region completely. In particular by the opening, the first semiconductor layer in the interruption and the first semiconductor layer in the functional region are separated completely from one another in the lateral direction so that during operation of the semiconductor component no radiation is generated or detected outside the region enclosed by the opening in the lateral direction, independently of the contact resistance between the metal layer and the first semiconductor layer and independently of the transverse conductivity of the first semiconductor layer.

In a top view of the optoelectronic semiconductor component, the opening and the inner subregion of the isolating layer overlap. In the opening, the isolating layer can be adjacent to the active region or the second semiconductor layer.

In particular, the opening may be at least partially or completely filled with material of the isolating layer.

The functional region may have a plurality of individually controllable segments. For example, each segment is formed as a pixel of a display device or a light source such as a headlight, in particular an adaptive headlamp of a motor vehicle.

The second terminal layer may form a common connection for the segments. In this case, the first terminal layer is divided into individual subregions, each of which is configured to electrically contact one segment. In a plan view of the semiconductor component, an outer outline of the subregions runs within a region enclosed by the interruption. The interruption thus encloses all subregions of the first terminal layer.

The semiconductor body may be arranged on a carrier. For example, a control circuit for the segments is integrated in the carrier. The carrier can also mechanically stabilize the semiconductor body so that a growth substrate for the epitaxial deposition of the semiconductor layer sequence of the semiconductor body is no longer required and can be removed. The first terminal layer and the second terminal layer run, for example, between the semiconductor body and the carrier. A radiation passage surface of the semiconductor body facing away from the carrier can be completely free of metallic layers for the electrical contacting of the semiconductor component. The risk of shading the active region is thus avoided.

The active region may extend continuously over the entire functional region. In other words, the semiconductor component can have exactly one functional region configured to generate or receive radiation during operation. For example, the optoelectronic semiconductor component is an LED semiconductor chip that has exactly one first electrical contact to electrically contact the first semiconductor layer and exactly one second electrical contact to externally electrically contact the second semiconductor layer.

Further developments and functionalities will become apparent from the following description of examples in connection with the figures.

Identical, equivalent or equivalently acting elements are indicated with the same reference signs in the figures.

The figures are schematic illustrations and thus not necessarily true to scale. Comparatively small elements and particularly layer thicknesses can rather be illustrated exaggeratedly large for the purpose of better clarification.

Figure 1B:
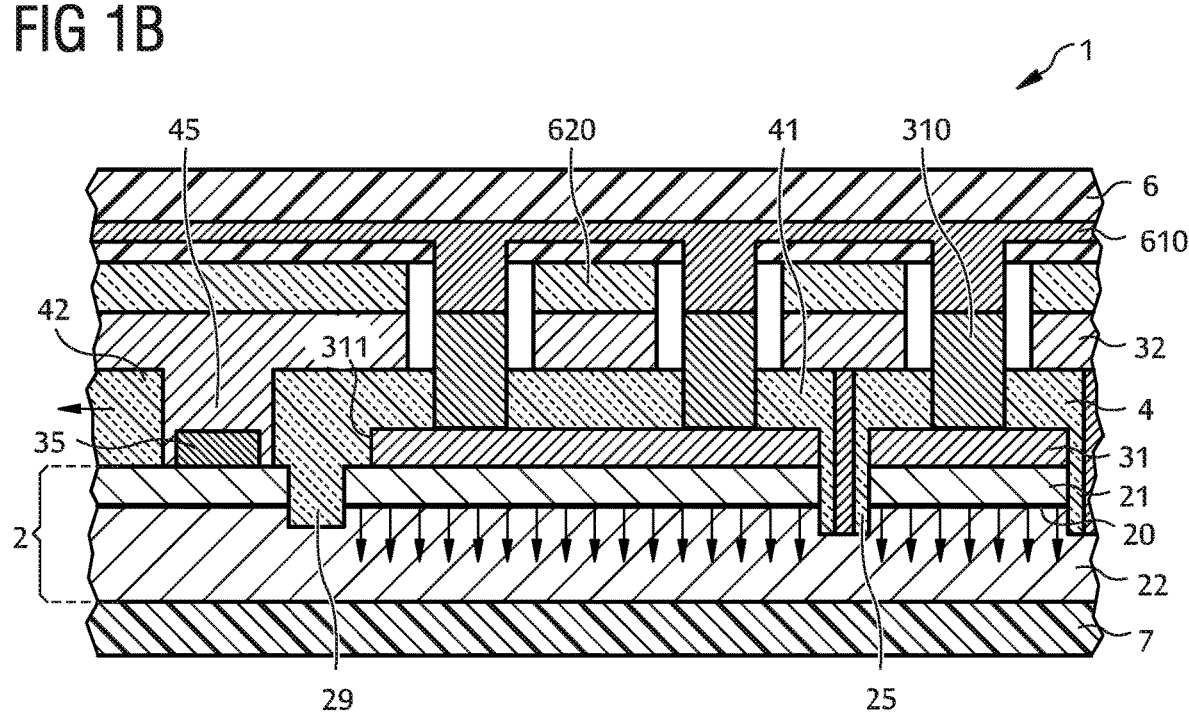

A first example of an optoelectronic semiconductor component 1 is shown schematically in FIGS. 1A and 1B. The semiconductor component comprises a semiconductor body 2 having a semiconductor layer sequence. The semiconductor layer sequence has an active region 20 configured to generate and/or receive radiation.

For the sake of simplification, the following description of the figure refers to a semiconductor chip configured to generate radiation. However, this description can be applied analogously to a semiconductor component configured to receive radiation.

The active region 20 is located between a first semiconductor layer 21 and a second semiconductor layer 22 so that the active region 20 is in a pn-junction. For a simplified illustration, the active region is shown as the interface between the first semiconductor layer 21 and the second semiconductor layer 22. The active region, however, may be one layer or several layers located between the first semiconductor layer 21 and the second semiconductor layer 22, for example, in the form of a multiple quantum well structure.

The semiconductor body further has a functional region 24 in which the first semiconductor layer 21 electrically connects to a first terminal layer 31 and the second semiconductor layer 22 electrically connects to a second terminal layer 32. During operation of the optoelectronic semiconductor component 1, charge carriers are injected from opposite sides into the active region of the functional region 24 and recombine there under emission of radiation. The lateral expansion of the functional region is essentially determined by an outer outline 311 of the first terminal layer 31, in particular apart from a lateral current expansion in the first semiconductor layer 21. The first terminal layer preferably contains silver or is made of silver. Silver is characterized by a high reflectivity in the visible and ultraviolet spectral range so that the first terminal layer can fulfil the function of a mirror layer with regard to the radiation generated in the active region.

An isolating layer 4 is arranged on a side of the first terminal layer 31 facing away from the semiconductor body. The isolating layer 4 contains a dielectric material such as an oxide, a silicon oxide, or a nitride such as silicon nitride, or a layer sequence having at least two different dielectric materials such as silicon oxide and silicon nitride. The isolating layer 4 is adjacent to the first semiconductor layer 21 in places and the second semiconductor layer 22 in places. Furthermore, the isolating layer is arranged in areas between the first terminal layer 31 and the second terminal layer 32, especially when viewed from a vertical direction.

On the side facing away from the semiconductor body 2 and on the side surface, the first terminal layer is completely surrounded by material of the isolating layer, except for the areas where the first terminal layer 31 electrically conductively connects to a connection layer 310. In the functional region 24, the first terminal layer 31 is encapsulated by the isolating layer.

An interruption 45, which at least partially delimits an inner subregion of the isolating layer in the lateral direction, is formed in the isolating layer. In the example shown, the interruption is formed as a separation trench, which divides the isolating layer into the inner subregion 41 and an outer subregion 42. The inner subregion and the outer subregion are two laterally spaced subregions, wherein the outer subregion 42 encloses the inner subregion 41 preferably along the entire circumference of the inner subregion.

The interruption 45 encloses the functional region 24 in the lateral direction, in particular along the entire circumference. In contrast to the functional region 24, an edge region 26 of the semiconductor body enclosing the functional region 24 in the lateral direction is not configured for the emission of radiation. In particular, the edge region 26 electrically connects to either the first terminal layer 31 or the second terminal layer 32, but not to both the first terminal layer 31 and the second terminal layer 32.

The edge region 26 can also comprise a portion of the second semiconductor layer 22. In particular, the edge region may comprise a portion of the active region, a portion of the first semiconductor layer 21 and a portion of the second semiconductor layer 22.

In a plan view of the semiconductor component 1, the interruption 45 overlaps the active region 20. For better illustration, in the top views, the outlines of individual elements such as the interruption 45, are made visible which, in an actual top view, are covered by overlying layers. The active region 20 completely covers the interruption 45. In other words, the interruption 45 is located in a region of the semiconductor body where the active region 20 is also present. To form the interruption, the active region 20 does not have to be removed.

During operation of the optoelectronic semiconductor component 1, in the region of the interruption no charge carriers that generate radiation are injected into the semiconductor body or charge carriers generated by radiation absorption are not guided away from the semiconductor body.

In the interruption 45, a metal layer 35 adjoins the first semiconductor layer 21. During operation of semiconductor component 1, the metal layer 35 is at the same electrical potential as the second terminal layer 32 configured to electrically contact the second semiconductor layer 22.

A region of the first semiconductor layer 21 adjoining the metal layer 35 is electrically separated from the first semiconductor layer 21 of the functional region 24 by an opening 29. The opening extends in the vertical direction at least through the first semiconductor layer 21 and preferably also through the active region 20. The opening 29 can, for example, be produced wet-chemically or dry-chemically, for example, by a chlorine plasma and using a photomask. In this way, it can be easily and reliably avoided that charge carriers are injected into the semiconductor body 2 via the metal layer 35 or via the second terminal layer 32 in the reverse direction compared to the forward direction of the active region 20. The opening 29 is filled with isolating layer material.

Such an opening 29 for the lateral subdivision of the first semiconductor layer 21, however, is not absolutely necessary. This is explained in more detail in connection with FIGS. 2A to 2C.

In the example as shown, the metal layer 35 has a smaller lateral transverse expansion than the interruption 45. In the interruption, both the metal layer 35 and the second terminal layer 32 are adjacent to the first semiconductor layer 21 of the semiconductor body. In deviation from this, however, the metal layer 35 can also have a greater lateral transverse expansion than the interruption 45. This is explained in more detail in connection with FIGS. 4A to 4C.

Moreover, the semiconductor component 1 has a carrier 6. The carrier serves in particular for the mechanical stabilization of the semiconductor body 2 so that a growth substrate is no longer necessary for the semiconductor layer sequence of the semiconductor body 2 and the optoelectronic semiconductor component can be free of the growth substrate.

The carrier 6 has a first carrier layer 610 and a second carrier layer 620 electrically connected to the first terminal layer 31 and the second terminal layer 32, respectively. The first terminal layer 31 is electrically contacted via the connection layer 310.

The second semiconductor layer 22 is electrically contacted via recesses 25 in which the second terminal layer 32 extends through the first semiconductor layer 21 and the active region 20. The side surfaces of the recesses 25 are covered by the isolating layer 4.

The optoelectronic semiconductor component 1 has exactly one functional region 24. The active region 20 extends continuously over the functional region 24. To externally electrically contact the semiconductor component 1, exactly one first contact 51 and exactly one second contact 52 can be provided for the electrical contacting of the first semiconductor layer 21 and for the external electrical contacting of the second semiconductor layer 22.

During the manufacture, the electrical contact between the carrier layers of the carrier 6 and the associated terminal layers 31, 32 can be formed by a solder using a melting process, for example.

Furthermore, a further isolating layer 7 is arranged on that side of the semiconductor body facing away from the carrier 6. The further isolating layer extends in particular over the entire surface of the semiconductor body 2 facing away from the carrier 6. In particular, the further isolating layer covers the outer side surface of the semiconductor body, preferably completely.

The interruption 45 of the isolating layer 4 forms a separation trench, wherein in a plan view of the semiconductor component 1 the interruption is located below the active region 20. To produce the interruption, the isolating layer 4 can, for example, be etched wet-chemically, e.g. using BOE, or dry-chemically, e.g. using a plasma containing fluorine.

To form the metal layer 35 a corrosion-resistant metal is particularly suitable which is in direct contact with the first semiconductor layer, for instance with a p-type semiconductor material based on a nitride compound semiconductor material.

Based on "a nitride compound semiconductor material" means that the semiconductor layer sequence or at least a part of it, particularly preferably at least the active region and/or the growth substrate, comprises or consists of a nitride compound semiconductor material, preferably of $Al_xIn_yGa_{1-x-y}N$, wherein $0 \leq x \leq 1$, $0 \leq y \leq 1$ and $x+y \leq 1$. This material does not necessarily have to have a mathematically exact composition according to the above formula. Rather, it may, for example, contain one or more dopants and additional components. For the sake of simplicity, however, the above formula contains only the essential components of the crystal lattice (Al, Ga, In, N), even if these may be partially replaced and/or supplemented by small quantities of other substances.

To improve adhesion between the metal layer 35 and the first semiconductor layer 21, a thin adhesion promoter layer may be provided, e.g. the layer may contain or consist of titanium, platinum or palladium. To obtain a good adhesion to the isolating layer 4, especially to an isolating layer containing silicon oxide and/or silicon nitride, for instance titanium, aluminium or chromium is suitable.

The metal layer 35 can also be used to improve adhesion between the first semiconductor layer 21 and the second terminal layer 32. The metal layer 35, however, can also be dispensed with.

A moisture path within the isolating layer 4 or along an interface between the isolating layer 4 and the first semiconductor layer 21 can be prevented by the interruption 45 in the form of a circumferentially enclosing interruption of the isolating layer 4. In addition, the first, for example, p-conductive semiconductor layer 21 is in electrical contact with material that is at the same electrical potential as the second terminal layer 32 configured to electrically contact the second, for example, n-conductive semiconductor layer 22. In a silver-containing first terminal layer 31, migration of silver can thus be reduced as far as possible.

Figure 2A:
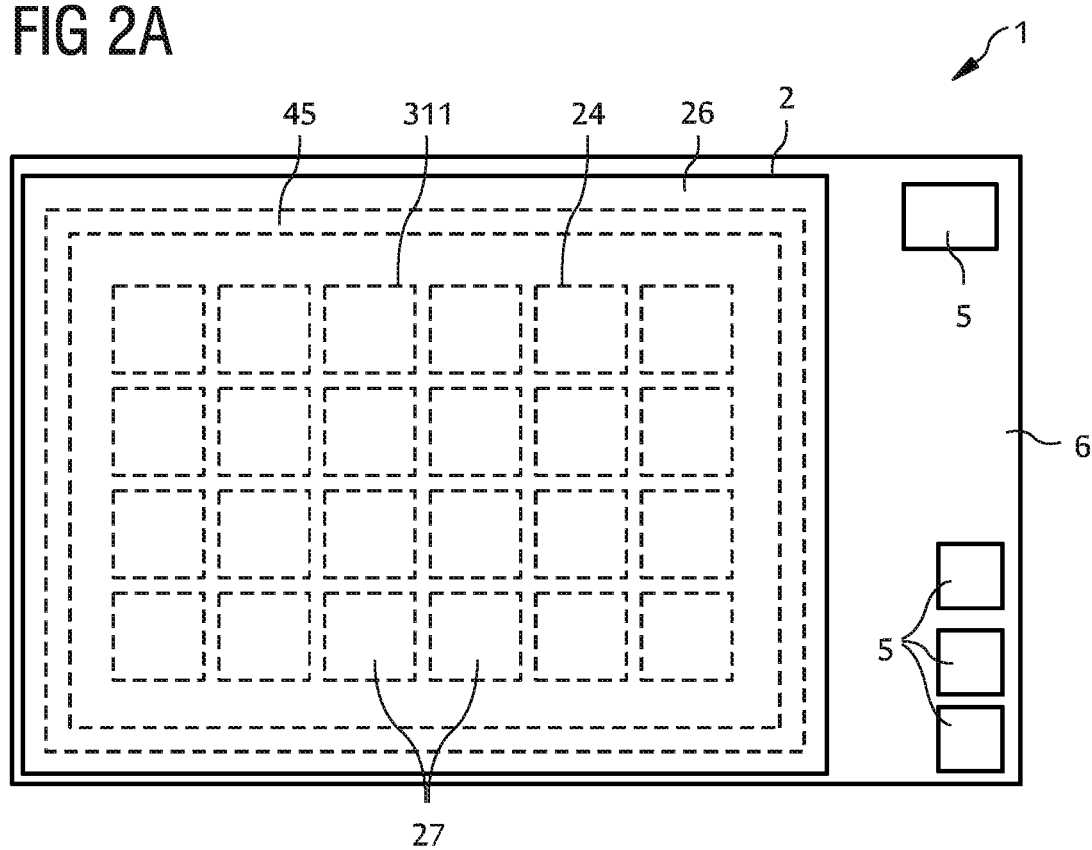
FIGS. 2A to 2C show a second example of an optoelectronic semiconductor component using a schematic plan view (FIG. 2A), a section in a plan view (FIG. 2B) and a section in a sectional view (FIG. 2C).

The second example shown in FIGS. 2A to 2C essentially corresponds to the first example described in connection with FIGS. 1A and 1B. In contrast thereto, the functional region 24 of the semiconductor body 2 has a plurality of segments 27.

The individual segments 27 electrically connect to a continuous second terminal layer 32. Each individual segment can be individually controlled via a subregion of the first terminal layer 31 assigned to each segment 27. For this purpose, through-recesses may be provided in the second terminal layer, through which the first terminal layer is electrically contacted. An outer outline 311 in the form of an envelope of the subregions of the first terminal layer 31 is shown in FIG. 2A as a dashed line. This outer outline essentially determines the lateral extent of the functional region. The interruption 45 therefore encompasses all segments of the functional region 24.

Figure 2B:
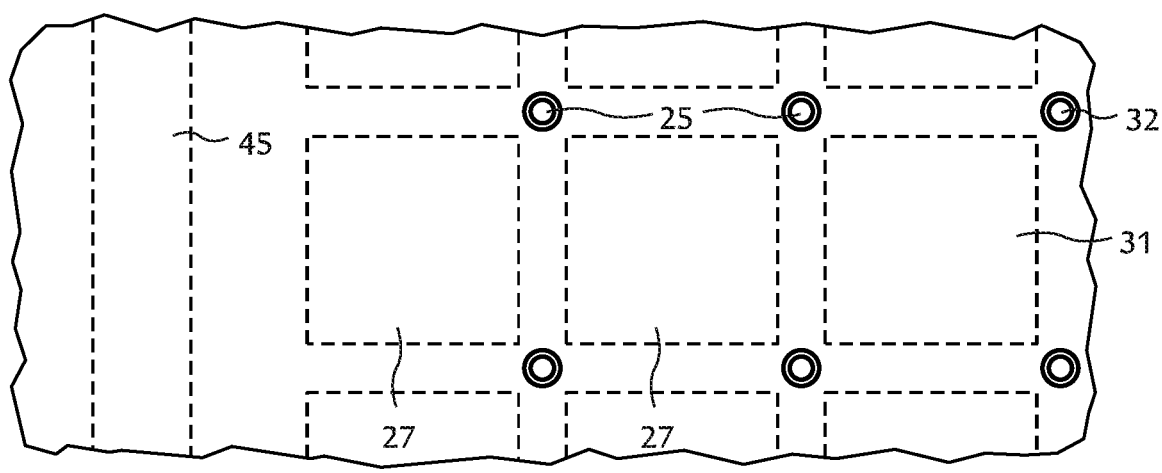
Figure 2C:
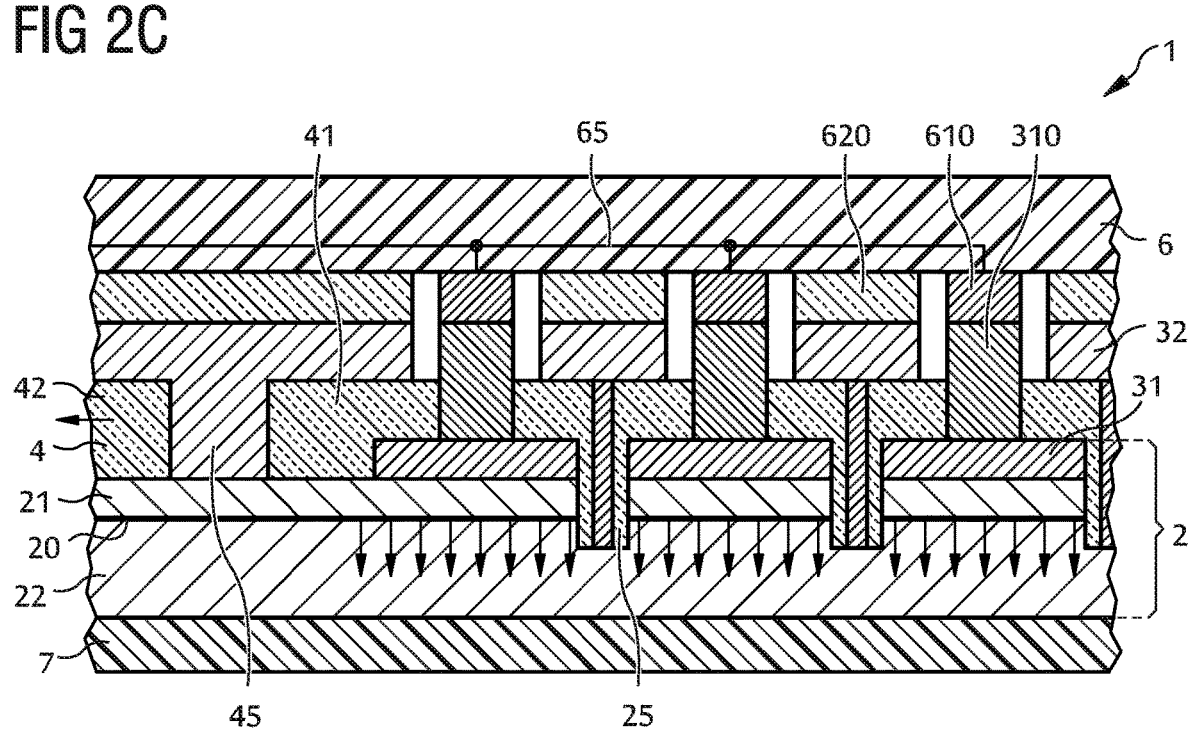

FIG. 2B shows a cutout from the semiconductor component 1. The recesses 25 for the electrical contacting of the second semiconductor layer 22 run between the individual segments 27 so that for the electrical contacting purposes, the active region 20 within the segments does not have to be pierced by the recess. Deviating from this, however, it is possible for one or more recesses to extend through the first terminal layer 31 of one segment.

For example, the carrier has contacts 5 and a control circuit 65, which, for example, comprises integrated circuit elements for individual control of the individual segments. The contacts 5 can be used to electrically connect the supply of current or voltage required for the operation of the semiconductor component 1. Thus, the individual segments are externally supplied directly or indirectly by the control circuit via the contacts 5. An assignment of exactly two contacts for each segment is not required for the operation of the semiconductor component 1.

The control circuit 65 may also be present in the following examples and is not explicitly shown merely for the sake of a simplified illustration in the corresponding figures. Such an optoelectronic semiconductor component is suitable, for example, for a display component or for an adaptive front headlamp having individually controllable segments.

Furthermore, according to the second example, the semiconductor component does not have an opening 29 that subdivides the first semiconductor layer 21. In this case, the electrical connection between the second terminal layer 32 and the first semiconductor layer 21 is formed in the interruption 45 such that in the region of the interruption 45 no significant current flow into the first semiconductor layer 21 occurs during operation of the semiconductor component. For example, a Schottky diode, whose forward direction is antiparallel with respect to the forward direction of the active region, may be formed between the first semiconductor layer 21 and the second terminal layer 32. Other constructions to increase the contact resistance can also be used.

Alternatively or in addition, local damage to the first semiconductor layer 21 can occur in the region of the interruption. This is explained in more detail in connection with FIGS. 6A to 6C.

Figure 3A:
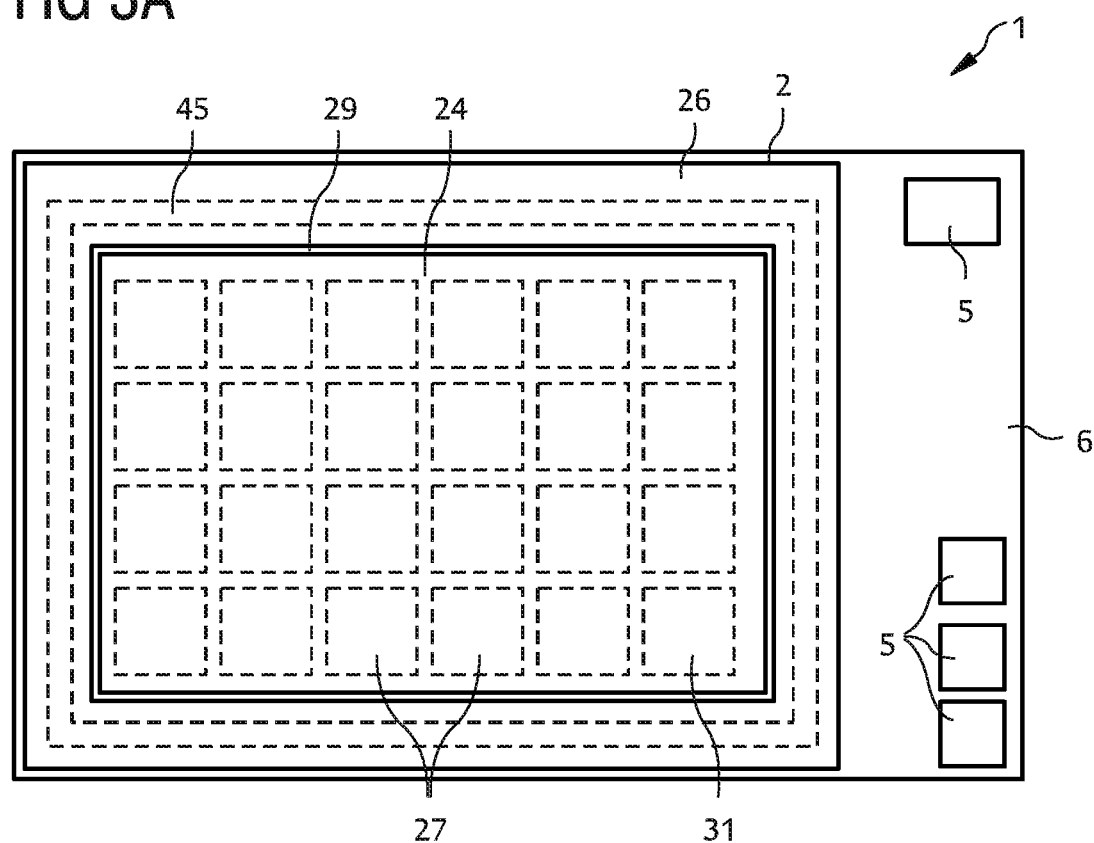
FIGS. 3A to 3C show a third example of an optoelectronic semiconductor component using a schematic plan view (FIG. 3A), a section in a plan view (FIG. 3B) and a section in a sectional view (FIG. 3C).
Figure 3B:
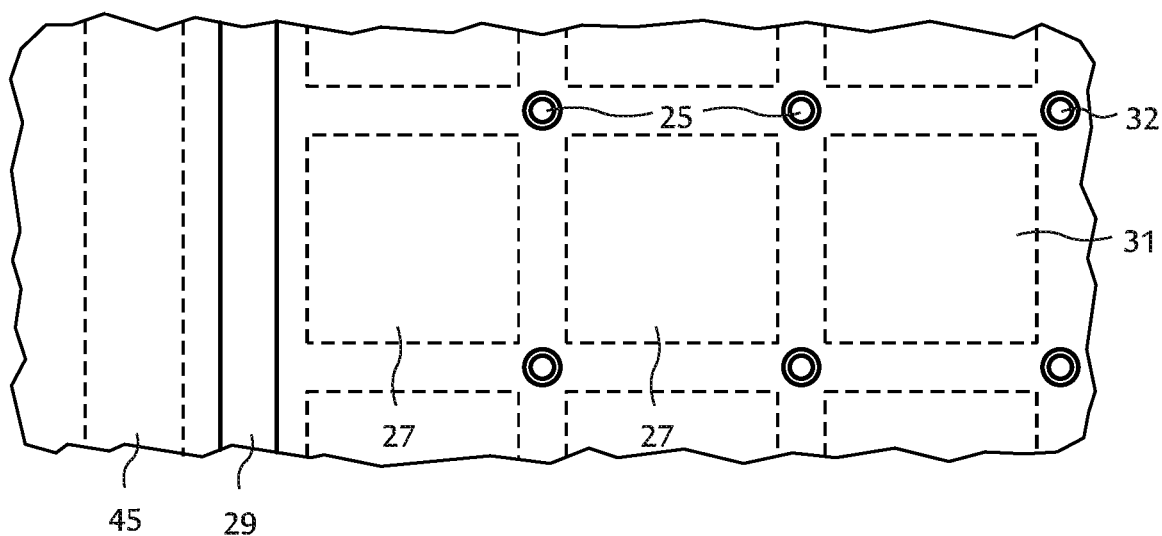
Figure 3C:
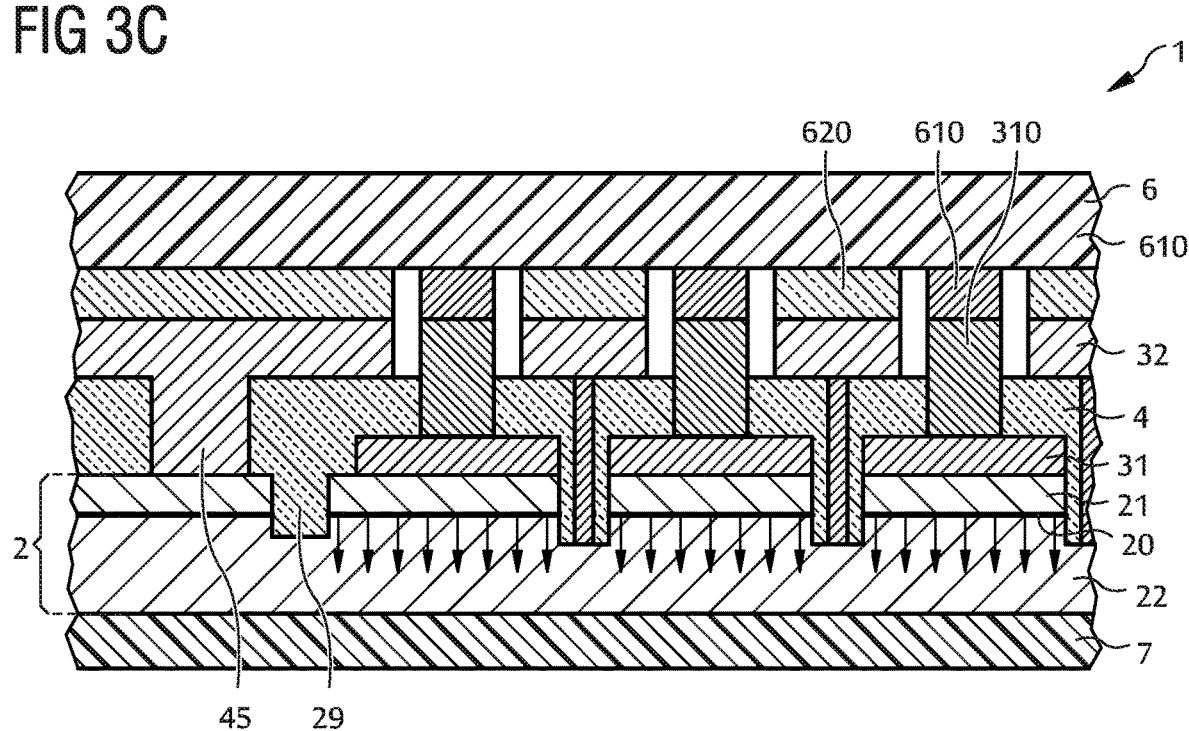

The example shown in FIGS. 3A to 3C essentially corresponds to the example described in connection with FIGS. 2A to 2C. In contrast thereto, the semiconductor component 1 has an opening 29 formed as described in FIGS. 1A and 1B. Compared to the second example described in FIGS. 2A to 2C, potential small current weakness is resolved by this opening 29.

Figure 4A:
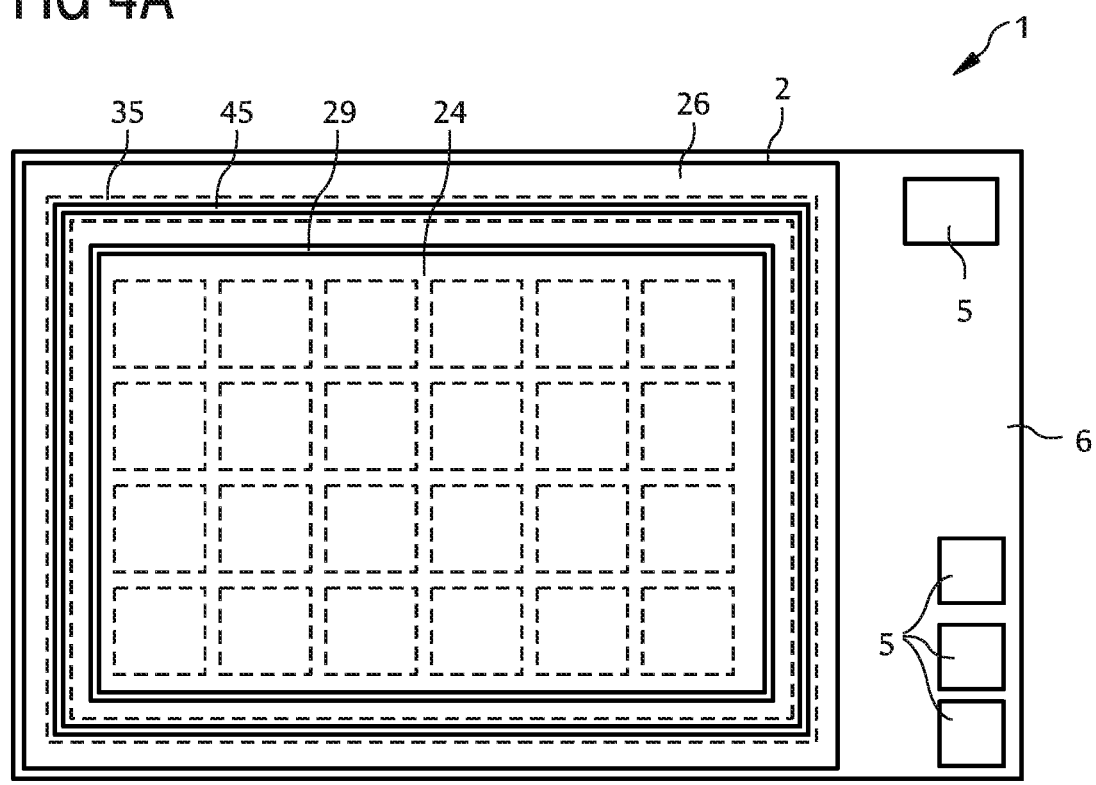
FIGS. 4A to 4C show a fourth example of an optoelectronic semiconductor component using a schematic plan view (FIG. 4A), a section in a plan view (FIG. 4B) and a section in a sectional view (FIG. 4C).
Figure 4B:
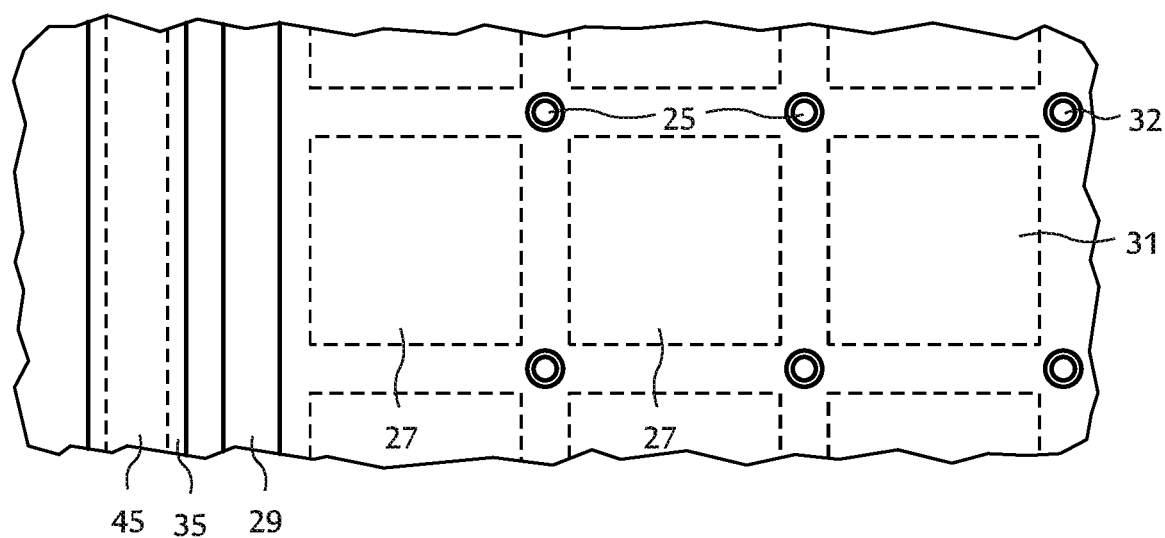
Figure 4C:
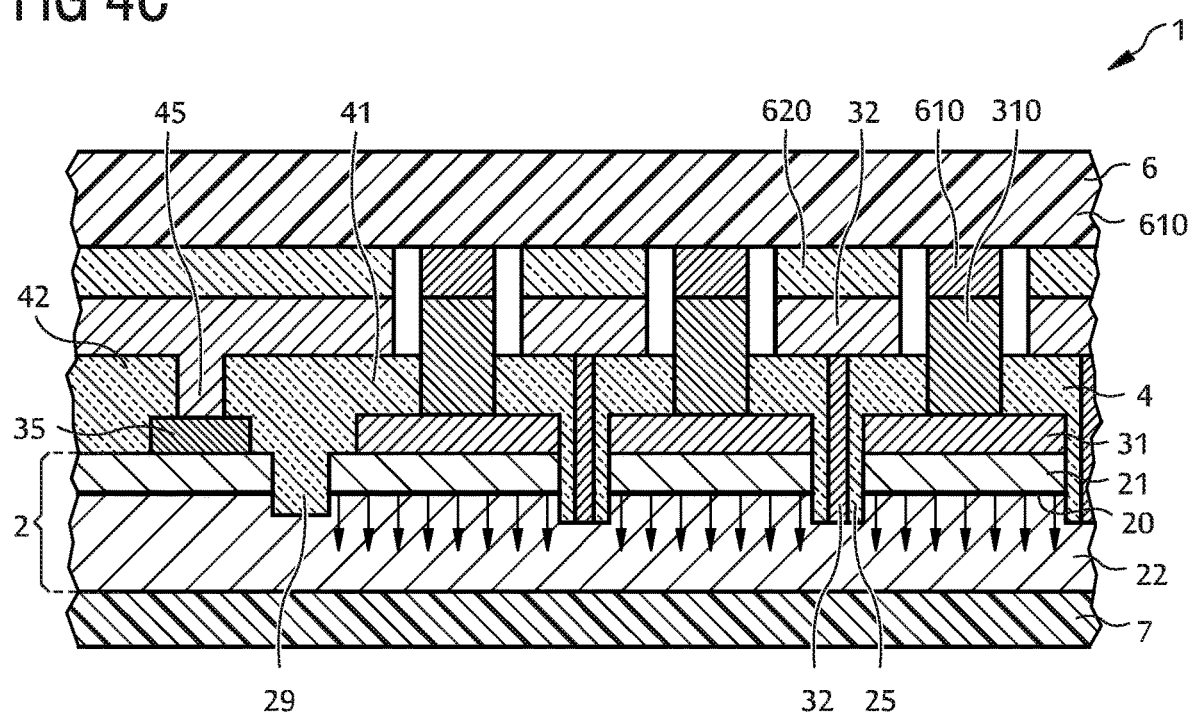

The example shown in FIGS. 4A to 4C essentially corresponds to the third example described in connection with FIGS. 3A to 3C. In contrast thereto, as described in FIGS. 1A and 1B, the optoelectronic semiconductor component 1 has a metal layer 35 which, in the interruption 45, is adjacent to the first semiconductor layer 21. In the example as shown, expansion of the metal layer 35 in the lateral direction transverse to a main direction of expansion of the interruption is greater than the corresponding lateral expansion of the interruption 45. The second terminal layer 32 does not directly adjoin the first semiconductor layer 21 at any point. With regard to its material, the second terminal layer can thus be selected independently from a potential contact resistance to the first semiconductor layer 21. In this example, the contact properties in connection with the first semiconductor layer 21 are adjustable by the metal layer 35 and independently from the second terminal layer 32.

Moreover, the isolating layer 4, in particular both the inner subregion 41 and the outer subregion 42, cover/s the metal layer in places.

Figure 5A:
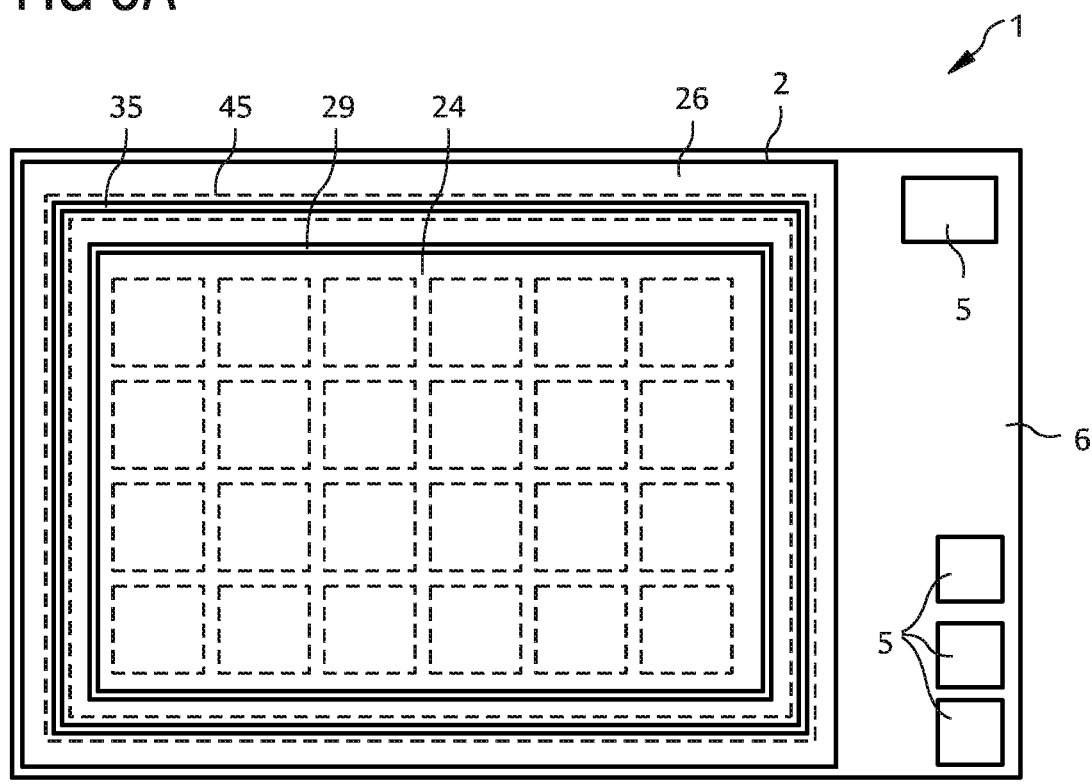
FIGS. 5A to 5C show a fifth example of an optoelectronic semiconductor component using a schematic plan view (FIG. 5A), a section in a plan view (FIG. 5B) and a section in a sectional view (FIG. 5C).
Figure 5B:
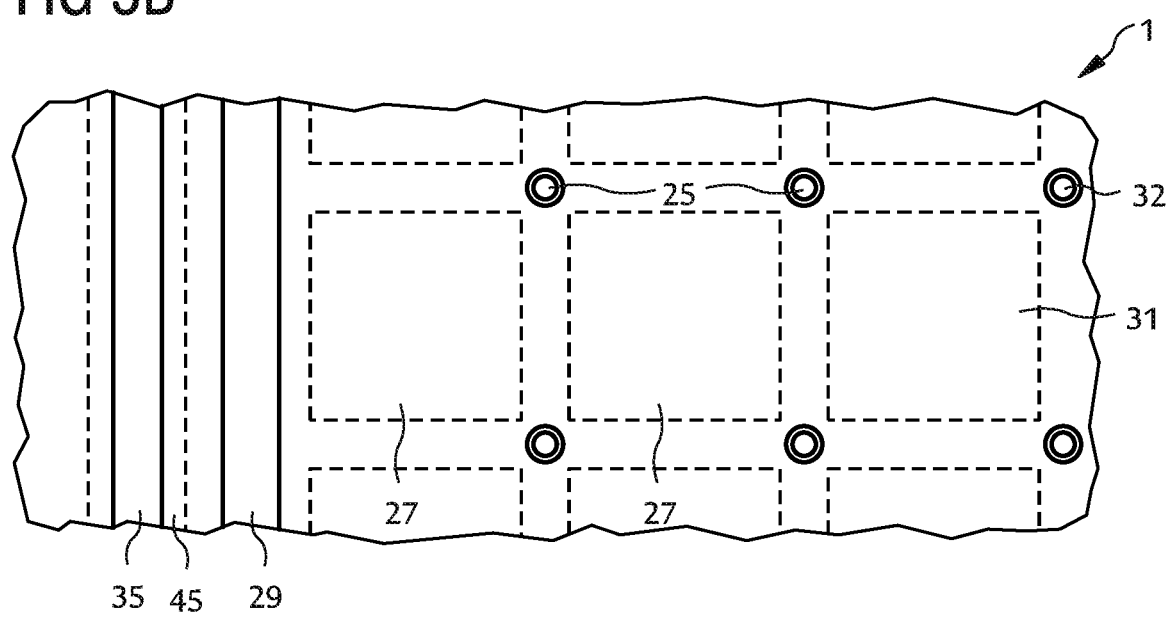
Figure 5C:
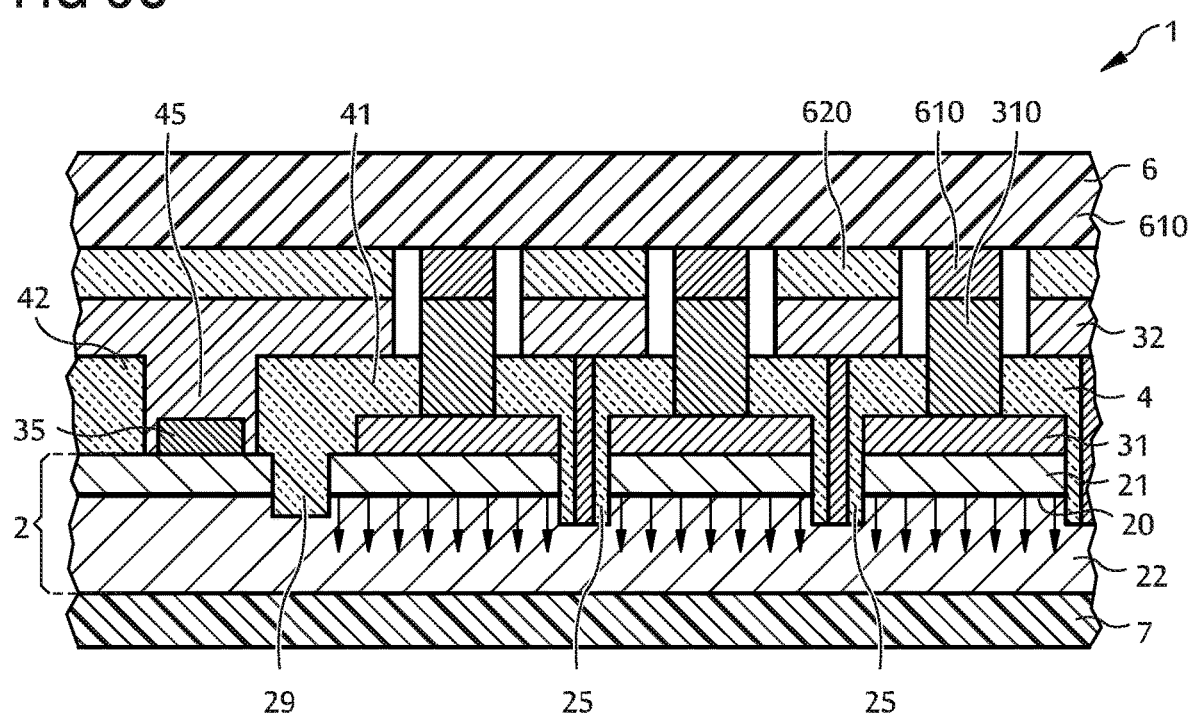

The example described in FIGS. 5A to 5C essentially corresponds to the fourth example described in connection with FIGS. 4A to 4C. In contrast thereto, the metal layer 35 has a smaller lateral expansion in the lateral direction transverse to the main direction of expansion of the interruption 45. In interruption 45, both the metal layer 35 and the second terminal layer 32 are directly adjacent to the first semiconductor layer 21.

Figure 6A:
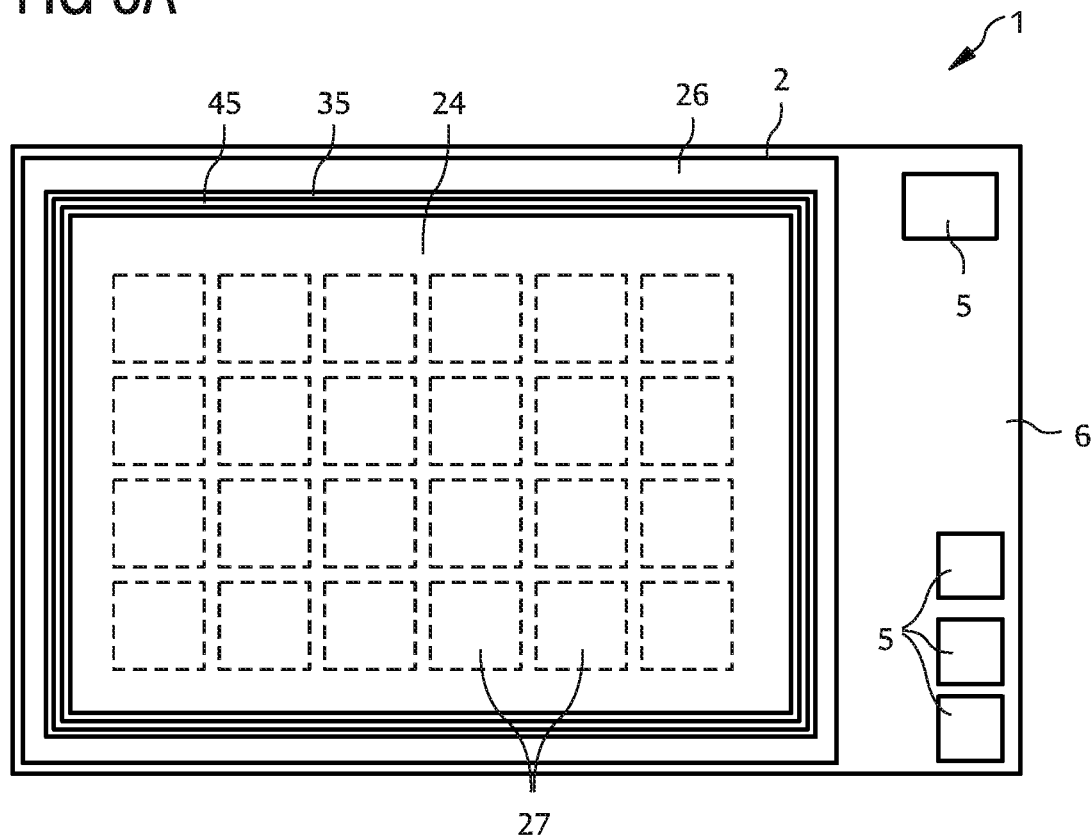
Figure 6B:
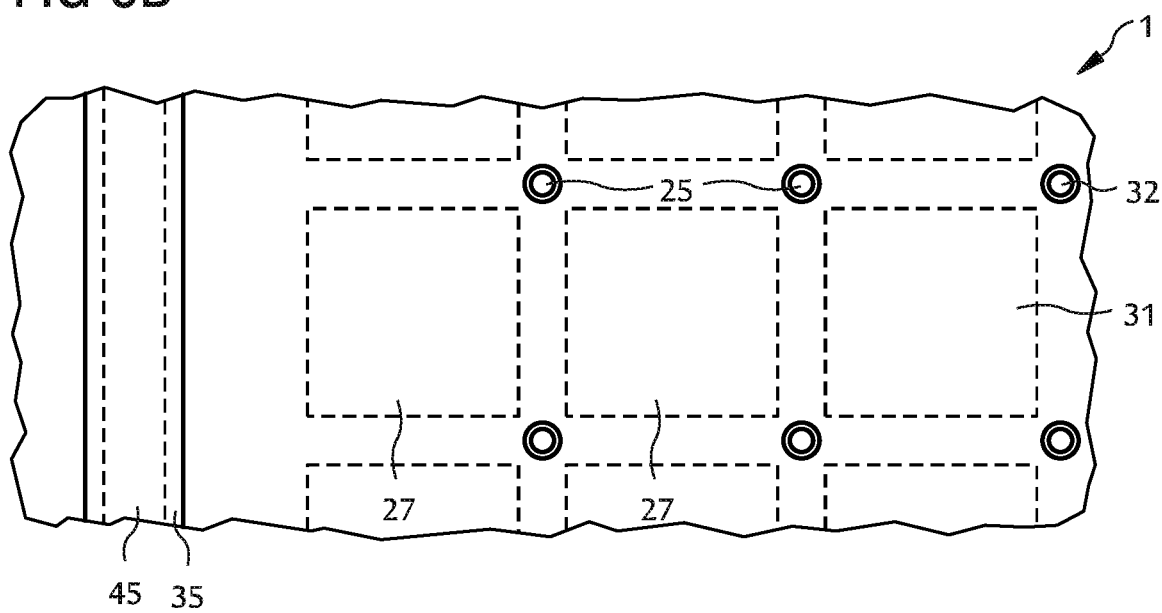

The third example shown in FIGS. 6A to 6C essentially corresponds to the second example described in connection with FIGS. 2A to 2C. In particular, the first semiconductor layer 21 is not divided by an opening 29. To avoid an injection of charge carriers via the second terminal layer 32 into the first semiconductor layer 21, a subregion 23 is formed in the first semiconductor layer 21 in a region overlapping the metal layer 35 in which the semiconductor body, in particular the first semiconductor layer 21, is damaged in a targeted manner. For example, the damage to a p-type first semiconductor layer 21 based on a nitride compound semiconductor material can be caused by a hydrogen plasma prior to deposition of the metal layer 35 or by a sputter deposition of the metal layer 35 having a targeted damaging effect. In the damaged subregion 23, the conductivity is so low that no significant injection of charge carriers takes place via the first semiconductor layer 21 into the active region 20 above the interruption 45.

This application claims priority of DE 10 2016 111 113.9, the subject matter of which is incorporated herein by reference.

My components are not restricted to the description made with reference to the examples. The disclosure rather comprises any novel feature and any combination of features, including in particular any combination of features in the appended claims, even if the feature or combination is not itself explicitly indicated in the claims or examples.

The invention claimed is:

1. An optoelectronic semiconductor component having a semiconductor body, wherein the semiconductor body comprises a semiconductor layer sequence having a first semiconductor layer, a second semiconductor layer and an active region that generates or receives radiation disposed between the first semiconductor layer and the second semiconductor layer;

the semiconductor body has a functional region in which the first semiconductor layer electrically conductively connects to a first terminal layer and the second semiconductor layer electrically conductively connects to a second terminal layer;

an isolating layer is arranged on a side of the first terminal layer facing away from the semiconductor body;

an interruption is formed in the isolating layer which at least locally delimits an inner subregion of the isolating layer in a lateral direction;

the interruption encloses the functional region in the lateral direction; and in a plan view of the semiconductor component, the interruption overlaps with the active region.

2. The optoelectronic semiconductor component according to claim 1, wherein, during operation of the optoelectronic semiconductor component, in the region of the interruption no charge carriers that generate radiation are injected into the semiconductor body or charge carriers generated by radiation absorption are not guided away from the semiconductor body.

3. The optoelectronic semiconductor component according to claim 1, wherein the isolating layer adjoins the semiconductor body in places.

4. The optoelectronic semiconductor component according to claim 1, wherein the interruption is formed as a separation trench that divides the isolating layer into at least two subregions being separated from each other.

5. The optoelectronic semiconductor component according to claim 1, wherein the semiconductor body has an edge region and, in a plan view of the semiconductor component, the inner subregion is spaced apart from the edge region.

6. The optoelectronic semiconductor component according to claim 1, wherein the semiconductor body has an opening extending in a vertical direction through the first semiconductor layer and located in the lateral direction between the interruption and the functional region.

7. The optoelectronic semiconductor component according to claim 6, wherein the opening is completely filled with material of the isolating layer.

8. The optoelectronic semiconductor component according to claim 1, wherein the functional region comprises a plurality of individually controllable segments.

9. The optoelectronic semiconductor component according to claim 8, wherein the second terminal layer forms a common terminal for the segments.

10. The optoelectronic semiconductor component according to claim 8, wherein the semiconductor body is arranged on a carrier in which a control circuit for the segments is integrated.

11. The optoelectronic semiconductor component according to claim 1, wherein the active region extends continuously over the entire functional region.

12. An optoelectronic semiconductor component having a semiconductor body, wherein
the semiconductor body comprises a semiconductor layer sequence having a first semiconductor layer, a second semiconductor layer and an active region that generates or receives radiation disposed between the first semiconductor layer and the second semiconductor layer;
the semiconductor body has a functional region in which the first semiconductor layer electrically conductively connects to a first terminal layer and the second semiconductor layer electrically conductively connects to a second terminal layer;
an isolating layer is arranged on a side of the first terminal layer facing away from the semiconductor body;
an interruption is formed in the isolating layer which at least locally delimits an inner subregion of the isolating layer in a lateral direction;
the interruption encloses the functional region in the lateral direction;
in a plan view of the semiconductor component, the interruption overlaps with the active region; and
in the interruption a metal layer adjoins the first semiconductor layer, wherein the metal layer is at the same potential as the second terminal layer during operation of the semiconductor component.

13. The optoelectronic semiconductor component according to claim 12, wherein the metal layer is an additional metal layer to the second terminal layer and has a greater lateral transverse expansion than the interruption.

14. The optoelectronic semiconductor component according to claim 12, wherein the metal layer is an additional metal layer to the second terminal layer and has a smaller lateral transverse expansion than the interruption.

15. The optoelectronic semiconductor component according to claim 12, wherein the metal layer is formed by the second terminal layer.

16. The optoelectronic semiconductor component according to claim 12, wherein a contact resistance between the metal layer and the first semiconductor layer is so high that during operation of the semiconductor component there is no or at least no significant current flow between the metal layer and the first semiconductor layer.

17. The optoelectronic semiconductor component according to claim 12, wherein a region of the semiconductor body adjacent to the metal layer is a subregion in which the semiconductor body is damaged in a targeted manner.

18. An optoelectronic semiconductor component having a semiconductor body, wherein
the semiconductor body comprises a semiconductor layer sequence having a first semiconductor layer, a second semiconductor layer and an active region that generates or receives radiation disposed between the first semiconductor layer and the second semiconductor layer;
the semiconductor body has a functional region in which the first semiconductor layer electrically conductively connects to a first terminal layer and the second semiconductor layer electrically conductively connects to a second terminal layer;
an isolating layer is arranged on a side of the first terminal layer facing away from the semiconductor body;
an interruption is formed in the isolating layer which at least locally delimits an inner subregion of the isolating layer in a lateral direction;
the interruption encloses the functional region in the lateral direction;
in a plan view of the semiconductor component, the interruption overlaps with the active region; and
during operation of the optoelectronic semiconductor component, in the region of the interruption no charge carriers that generate radiation are injected into the semiconductor body or charge carriers generated by radiation absorption are not guided away from the semiconductor body.

* * * * *